United States Patent
Liu et al.

(10) Patent No.: US 7,704,884 B2
(45) Date of Patent: Apr. 27, 2010

(54) SEMICONDUCTOR PROCESSING METHODS

(75) Inventors: Junting Liu, Manassas, VA (US);
Er-Xuan Ping, Fremont, CA (US);
Seiichi Takedai, Bristow, VA (US)

(73) Assignee: Micron Technology, Inc., Boise, ID (US)

(*) Notice: Subject to any disclaimer, the term of this patent is extended or adjusted under 35 U.S.C. 154(b) by 34 days.

(21) Appl. No.: 12/101,332

(22) Filed: Apr. 11, 2008

(65) Prior Publication Data
US 2009/0258485 A1    Oct. 15, 2009

(51) Int. Cl.
*H01L 21/302* (2006.01)
(52) U.S. Cl. ...................................... 438/689
(58) Field of Classification Search .................. None
See application file for complete search history.

(56) References Cited

U.S. PATENT DOCUMENTS

| | | | |
|---|---|---|---|
| 6,150,711 A | 11/2000 | Kom et al. | |
| 6,404,216 B1 | 6/2002 | Tandy | |
| 6,573,547 B2 | 6/2003 | Ahn et al. | |
| 6,656,785 B2 | 12/2003 | Chiang et al. | |
| 6,825,129 B2 | 11/2004 | Hong | |
| 7,125,582 B2 | 10/2006 | McSwiney et al. | |
| 7,187,085 B2 | 3/2007 | Clevenger et al. | |
| 2004/0266126 A1 | 12/2004 | Lee | |
| 2005/0009267 A1 | 1/2005 | Belyansky et al. | |
| 2005/0255714 A1 | 11/2005 | Iyer et al. | |
| 2005/0270822 A1 | 12/2005 | Shrivastava et al. | |
| 2006/0017132 A1 | 1/2006 | Birner et al. | |
| 2006/0154464 A1 | 7/2006 | Higashi | |
| 2006/0186448 A1 | 8/2006 | Inoue et al. | |
| 2006/0211246 A1 | 9/2006 | Ishizaka et al. | |
| 2007/0034930 A1 | 2/2007 | Bhattacharyya | |
| 2007/0105377 A1* | 5/2007 | Koos et al. .................. | 438/689 |
| 2007/0111546 A1 | 5/2007 | Iyer et al. | |

(Continued)

FOREIGN PATENT DOCUMENTS

GB    2432363 A    5/2007

(Continued)

OTHER PUBLICATIONS

Kinam Kim "Technology for sub-50nm DRAM and NAND Flash Manufacturing" Aug. 2005, IEEE, 4 pages.

(Continued)

*Primary Examiner*—Charles D Garber
*Assistant Examiner*—Andre' C Stevenson
(74) *Attorney, Agent, or Firm*—Wells St. John P.S.

(57) ABSTRACT

Some embodiments include methods in which insulative material is simultaneously deposited across both a front side of a semiconductor substrate, and across a back side of the substrate. Subsequently, openings may be etched through the insulative material across the front side, and the substrate may then be dipped within a plating bath to grow conductive contact regions within the openings. The insulative material across the back side may protect the back side from being plated during the growth of the conductive contact regions over the front side. In some embodiments, plasma-enhanced atomic layer deposition may be utilized to for the deposition, and may be conducted at a temperature suitable to anneal passivation materials so that such annealing occurs simultaneously with the plasma-enhanced atomic layer deposition.

19 Claims, 6 Drawing Sheets

U.S. PATENT DOCUMENTS

| | | | |
|---|---|---|---|
| 2007/0116887 A1 | 5/2007 | Faguet | |
| 2007/0145454 A1 | 6/2007 | Bhattacharyya | |
| 2007/0209590 A1 | 9/2007 | Li | |
| 2007/0234538 A1 | 10/2007 | Ahn | |
| 2007/0238031 A1 | 10/2007 | Lee et al. | |
| 2007/0238316 A1 | 10/2007 | Ohashi | |
| 2007/0251445 A1 | 11/2007 | Ishizaka | |
| 2007/0278619 A1 | 12/2007 | Clevenger et al. | |
| 2008/0081409 A1* | 4/2008 | Song et al. | 438/250 |
| 2009/0056994 A1* | 3/2009 | Kuhr et al. | 174/259 |

FOREIGN PATENT DOCUMENTS

| | | |
|---|---|---|
| JP | 2007150242 A | 6/2007 |
| WO | WO2004042804 A2 | 5/2004 |

OTHER PUBLICATIONS

Jae-Eun Park, et al. "Mass-Productive Ultra-Low Temperature ALD SiO2 Process Promising for Sub-90nm Memory and Logic Devices" IEEE, Feb. 2002, pp. 229-232.

H.S. Kim, et al. "An Outstanding and Highly Manufacturable 80nm DRAM Technology" May 2003, IEEE, pp. IEDM 03-411 through IEDM 03-414.

H.R. Huff, et al. "Integration of High-K Gate STack Systems Into Planar CMOS Process Flows" IWGI 2001, Tokyo, pp. 2-11.

Chit Hwei Ng, et al. "MIM Capacitor Integration for Mixed-Signal/RF Applications" IEEE Transactions on Electronic Devices, vol. 52, No. 7, Jul. 2005, pp. 1399-1409.

Kokusai Semiconductor Equipment Corporation, "Low Temperature Nitrides" http://www.ksec.com/processes/Low_temp.htm 2 pages.

Micron Technical Note "Wire-Bonding Techniques" http://download.micron.com/pdf/technotes/nand/tn2924.pdf, 5 pages.

* cited by examiner

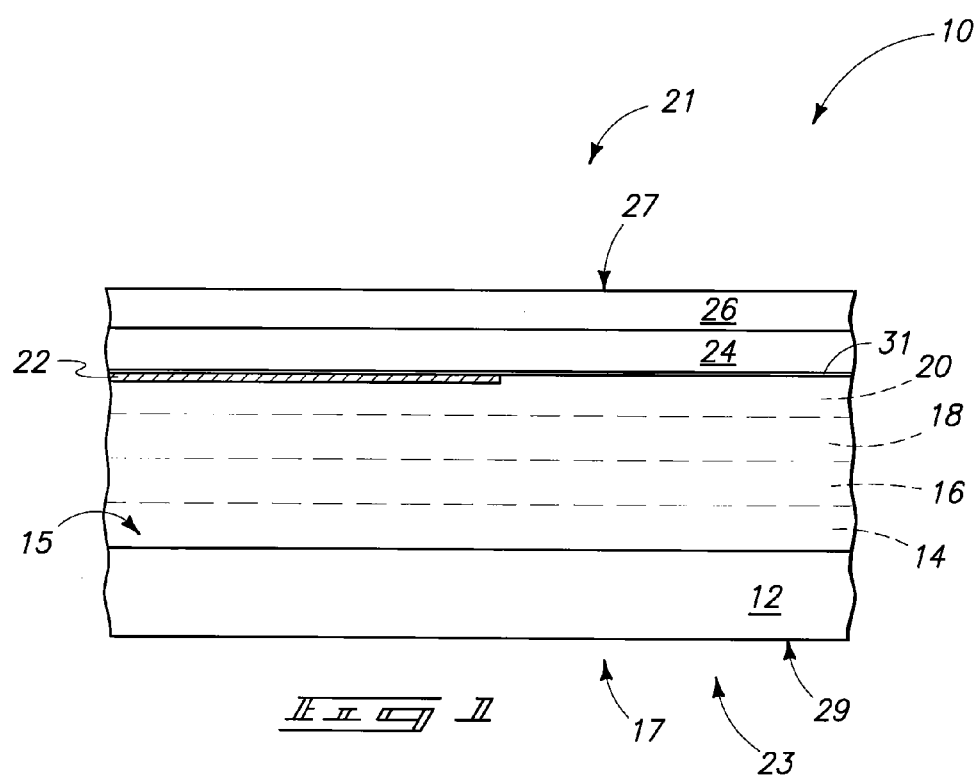
F I G 1
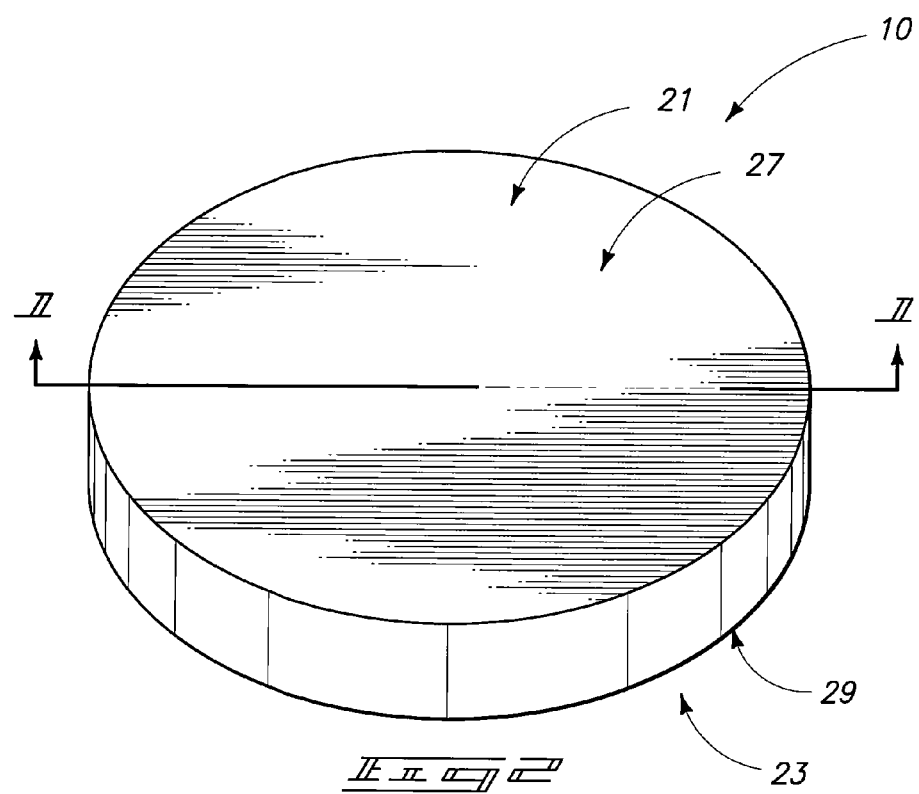
F I G 2

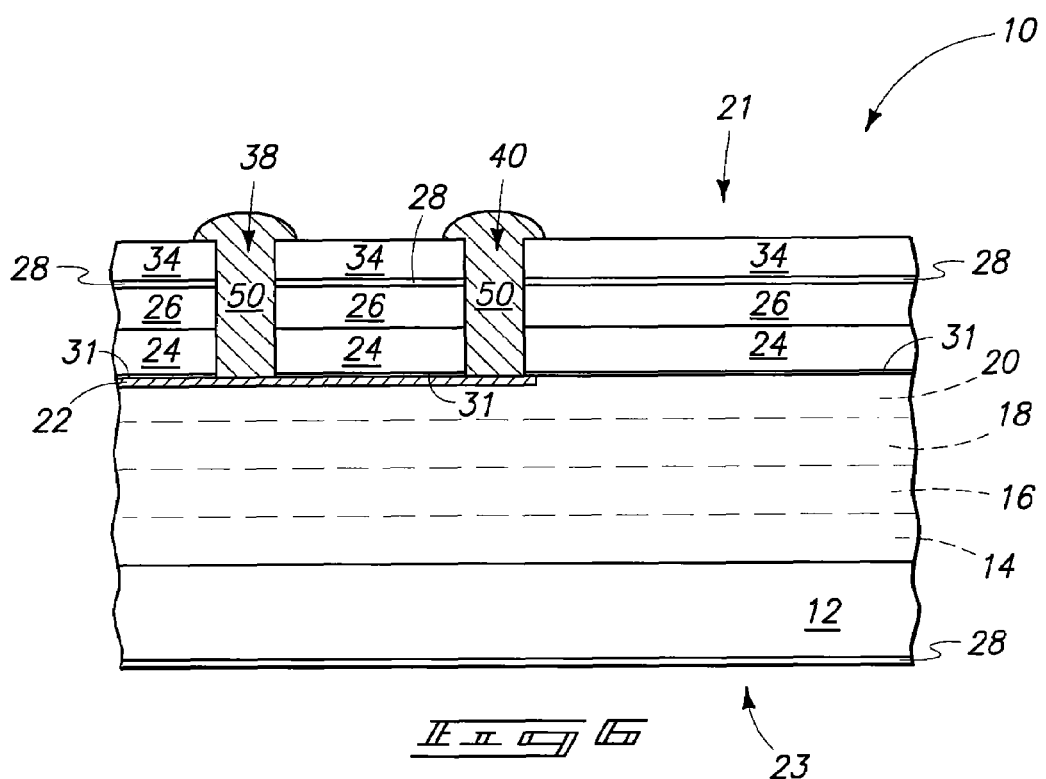
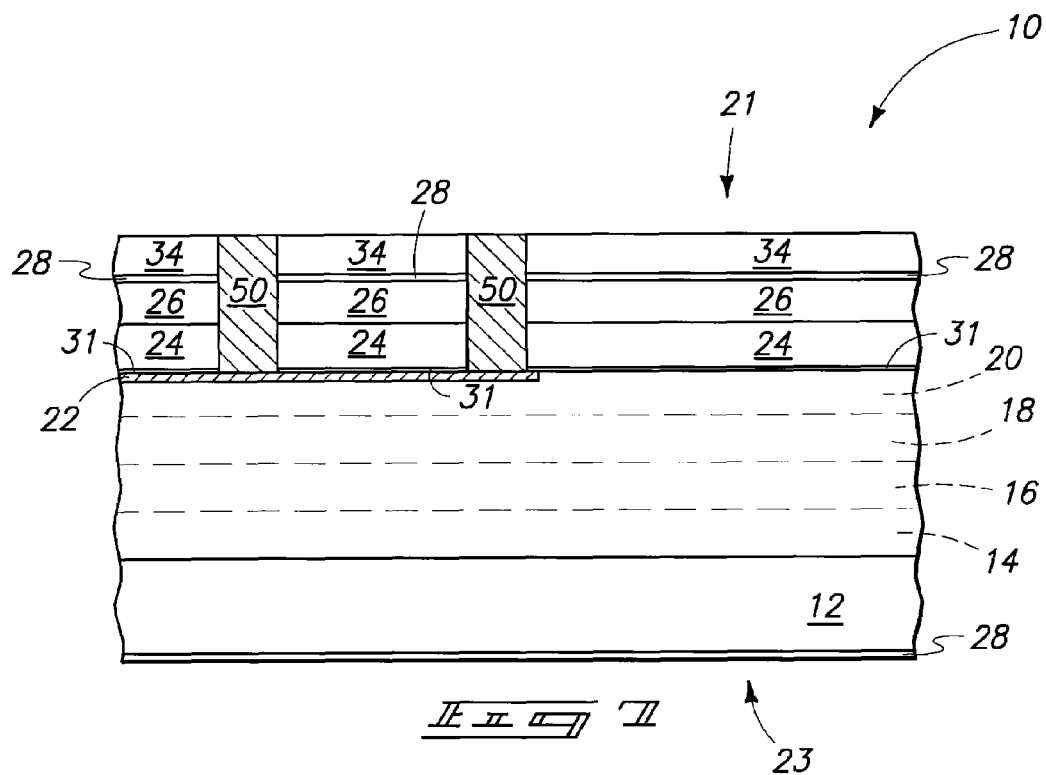

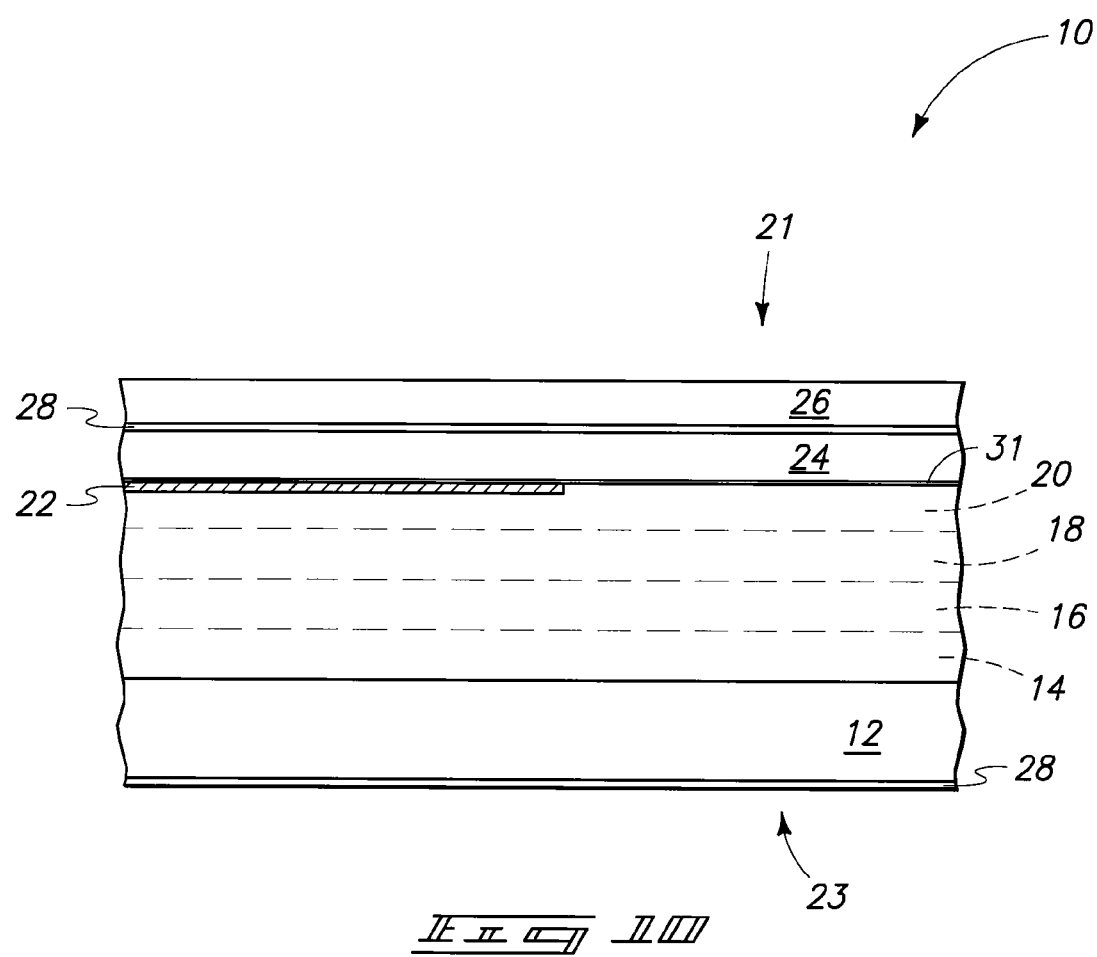

SEMICONDUCTOR PROCESSING METHODS

TECHNICAL FIELD

Semiconductor processing methods, methods of forming conductive contact regions for semiconductor wafer substrates, and methods of protecting a semiconductor wafer back side during plating of materials on the semiconductor wafer front side.

BACKGROUND

Semiconductor constructions may comprise integrated circuitry supported by a semiconductor wafer (such as, for example, a monocrystalline silicon wafer). The integrated circuitry may include logic and/or one or more memory arrays (such as, for example, dynamic random access memory (DRAM), and/or NAND memory).

The semiconductor constructions may also comprise electrically conductive layers utilized to connect components of the integrated circuitry with bond pad regions. Such electrically conductive layers may be referred to as redistribution layers, in that they redistribute electrical connections from one portion of a semiconductor construction to another. Alternatively, such electrically conductive layers may be referred to as bond pad supporting layers.

The bond pad regions may comprise one or more electrically conductive layers formed over the bond pad supporting layers, and may be suitable for connection to wire bonds, solder, or other materials utilized for electrical connection to circuitry external of the semiconductor construction.

Difficulties may be encountered during formation of the bond pad regions. Specifically, the bond pad regions may be plated onto the bond pad supporting layers by dipping the semiconductor construction within a plating bath. The semiconductor construction will have a front side comprising the bond pad supporting layers, and will have a back side in opposing relation to the front side. If plating occurs on the back side, such can waste plating components, and such may also form electrically conductive structures which compromise performance of the integrated circuitry associated with the wafer.

One method of addressing such difficulties is to form an electrically insulative layer across the back side prior to dipping the semiconductor construction within a plating bath. However, formation of the electrically insulative layer comprises flipping the semiconductor construction so that the back side surface is up, followed by chemical vapor deposition (CVD) of insulative material on the back side surface. The semiconductor construction is then flipped back over so that the front side surface is up for subsequent processing. The flipping of the semiconductor construction can cause abrasions or other defects. It is desired to develop methods which avoid plating on the back side surface of a semiconductor construction, and yet which also avoid the problematic flipping of the semiconductor construction.

Another aspect of the prior art is that there will often be one or more passivation layers formed over the bond pad supporting layers. Such passivation layers may include a silicon nitride-containing layer. It is often desired to anneal the silicon nitride-containing passivation layer at a temperature sufficiently high to promote hydrogen migration from the passivation layer, and/or otherwise thermally treat the passivation layer. Such temperature may be at least about 400° C.

The anneal adds an additional process step. As each additional process step reduces throughput, creates risk of error, and increases cost; it is desired to reduce the number of process steps.

BRIEF DESCRIPTION OF THE DRAWINGS

FIG. 1 is a diagrammatic cross-sectional view of a fragment of a semiconductor construction at a processing stage of an embodiment.

FIG. 2 is a diagrammatic three-dimensional view of the semiconductor construction comprising the fragment of FIG. 1; with the cross-section of FIG. 1 being along the line 1-1 of FIG. 2.

FIG. 6 shows the fragment of FIG. 1 at a processing stage subsequent to that of FIG. 5.

FIG. 7 shows the fragment of FIG. 1 at a processing stage subsequent to that of FIG. 6.

FIG. 10 shows a fragment of a semiconductor construction in accordance with an embodiment alternative to that of FIG. 3.

DETAILED DESCRIPTION OF THE ILLUSTRATED EMBODIMENTS

Figure 3:
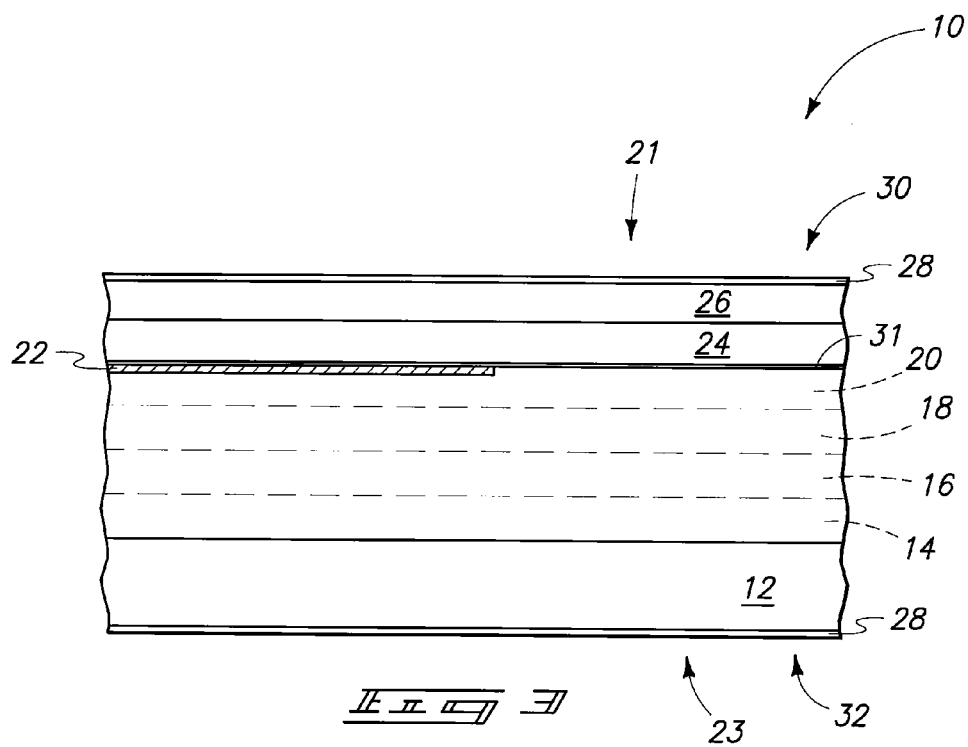
FIG. 3 shows the fragment of FIG. 1 at a processing stage subsequent to that of FIG. 1.

In some embodiments, insulative material (for instance, silicon nitride) is simultaneously deposited across both the front side and the back side of a semiconductor wafer substrate. The deposition may be accomplished utilizing any suitable method, such as, for example, plasma-enhanced atomic layer deposition (PEALD). The simultaneous deposition across the front side and back side may form a protective layer across the back side without the prior art flipping of the semiconductor wafer substrate. Further, the deposition may be conducted at a suitable temperature so that thermal treatment of passivation materials occurs during the deposition, which may consolidate process steps and thereby improve throughput and reduce costs. Another advantage may be that passivation film thickness can be reduced due to elimination of passivation film cracking, which may further reduce costs. The methodology may be utilized with any of numerous semiconductor constructions, including, for example, constructions comprising logic, DRAM arrays and/or NAND memory arrays.

Example embodiments are described with reference to FIGS. 1-10.

Referring to FIG. 1, such illustrates a fragment of a semiconductor construction 10. The semiconductor construction includes a bulk semiconductor base 12. Base 12 may comprise any suitable semiconductor composition, and may, for example, comprise, consist essentially of, or consist of monocrystalline silicon. In some embodiments, base 12 may correspond to monocrystalline silicon lightly background doped with p-type dopant. The monocrystalline silicon may be in the form of a wafer. The base 12, alone or in combination with other materials, may be referred to as a semiconductor substrate. The terms "semiconductive substrate" and "semiconductor substrate" are defined to mean any construction comprising semiconductor material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In the shown embodiment, semiconductor base 12 supports levels 14, 16, 18 and 20 of integrated circuitry. Although four levels are shown, in other embodiments there may be less than four levels or more than four levels. The levels of integrated circuitry are shown as blocks separated from one another by interfaces diagrammatically illustrated by dashed lines. The levels may include any of numerous semiconductor components and insulative materials isolating the components from one another. Further, one or more of the levels may extend into base 12. In some embodiments, one or more of the levels may comprise logic, DRAM and/or NAND memory. If the levels comprise DRAM, such may include transistors in combination with charge storage devices (for instance, capacitors); and if the levels comprise NAND memory, such may include nonvolatile memory comprising charge-trapping material.

The substrate 12 may be considered to comprise a front side surface 15 and a back side surface 17 in opposing relation to the front side surface. In the shown embodiment, all of the integrated circuit levels 14, 16, 18 and 20 are formed over the front side surface 15. In other embodiments, some integrated circuitry may also be formed over the back side surface 17. However, the majority of the integrated circuitry will generally be over the front side surface 15.

An electrically conductive line 22 extends over the uppermost integrated circuit level 20. The electrically conductive line 22 may comprise any suitable composition or combination of compositions, and may, for example, comprise, consist essentially of, or consist of copper or aluminum. The electrically conductive line 22 may correspond to a bond pad supporting layer. Accordingly, line 22 may be in electrical contact with integrated circuitry of one or more of levels 14, 16, 18 and 20, and utilized for electrically connecting the integrated circuitry of one or more of the levels to locations where bond pads are formed to connect with circuitry external of that contained within semiconductor construction 10.

Line 22 may be an example of one of many bond pad supporting layers formed across semiconductor construction 10.

A thin layer 31 is shown extending across line 22. Such thin layer may correspond to a barrier layer utilized to block copper diffusion. Another copper-diffusion-blocking layer (not shown) may be under line 22 in some embodiments. The barrier layer may be comprised of dielectric material, such as, for example, nitrogen-doped silicon carbide.

A first passivation material 24 is formed over line 22, and a second passivation material 26 is formed over the first passivation material 24. The first passivation material 24 may be a passivation oxide, and may, for example, comprise, consist essentially of, or consist of silicon dioxide. The second passivation material 26 may be a passivation nitride; and may, for example, comprise, consist essentially of, or consist of silicon nitride (for DRAM) or silicon oxynitride (for NAND). The first and second passivation materials may be formed utilizing any suitable processing, including, for example, chemical vapor deposition (CVD).

In the shown embodiment, the first passivation material 24 is directly against barrier layer 31 (in other words, touches the barrier layer); and the second passivation material 26 is directly against the first passivation material.

Construction 10 may be considered to have a front side and a back side analogous to the front and back sides of base 12. Specifically, construction 10 may be considered to have a front side 21 comprising a surface 27 of passivation material 26; and to have a back side 23 comprising a surface 29 of base 12.

FIG. 2 shows a three-dimensional view of the construction 10 comprising the cross-section of FIG. 1. The various layers of FIG. 1 are not shown in FIG. 2 to simplify the drawing.

Referring to FIG. 3, insulative material 28 is deposited across the front side 21 and back side 23 of construction 10. The insulative material 28 across the front side 21 may be referred to as a first layer 30 of the insulative material, and the insulative material 28 along the back side 23 may be referred to as a second layer 32 of the insulative material.

The insulative material 28 may be formed by any suitable process, and in example embodiments may be formed by atomic layer deposition. The processing utilized to form material 28 deposits the material across all exposed surfaces of construction 10 (or at least all of the exposed surfaces that are of appropriate composition), regardless of the orientation of the surfaces within a process chamber. Since material 28 deposits simultaneously across the front side and back side of the wafer, the flipping of the semiconductor construction discussed above in the "background" section of this disclosure may be avoided. Specifically, insulative material 28 can be deposited across back side surface 23 even when the back side surface faces downwardly in a reaction chamber.

It may be desired to form material 28 at a processing temperature low enough to avoid melting or otherwise adversely affecting compositions within the integrated circuit levels 14, 16, 18 and 20; and yet high enough to anneal, or otherwise thermally treat, one or both of passivation materials 24 and 26. For instance, it may be desired to avoid melting of materials (for example, aluminum) utilized in wiring and other integrated structures. In some embodiments, it may be desired to form material 28 at a processing temperature of from greater than or equal to about 300° C. to less than or equal to about 500° C.; with an example processing temperature being about 450° C.

The processing temperature utilized for deposition of material 28 may be suitable for desired thermal treatment of various passivation materials. For instance, the thermal treatment may anneal the materials to cause hydrogen to migrate from passivation materials to transistors and other structures comprising semiconductor materials to terminate dangling bonds and thereby improve device performance. If the deposition of material 28 is at a sufficient temperature for desired thermal treatment of passivation materials, such thermal treatment may occur simultaneously with the deposition of material 28.

In some embodiments, material 28 may comprise, consist essentially of, or consist of one or both of silicon nitride and silicon oxynitride; and may be formed by PEALD. The PEALD may be conducted while maintaining construction 10 at a temperature of from about 300° C. to about 500° C. (with an example temperature being about 450° C.). The silicon nitride, or silicon oxynitride, may be deposited from any suitable precursors. Example precursors include dichlorosilane and ammonia. The precursors may be flowed into a reaction chamber utilizing any suitable carrier gas, such as, for example, nitrogen.

Figure 8:
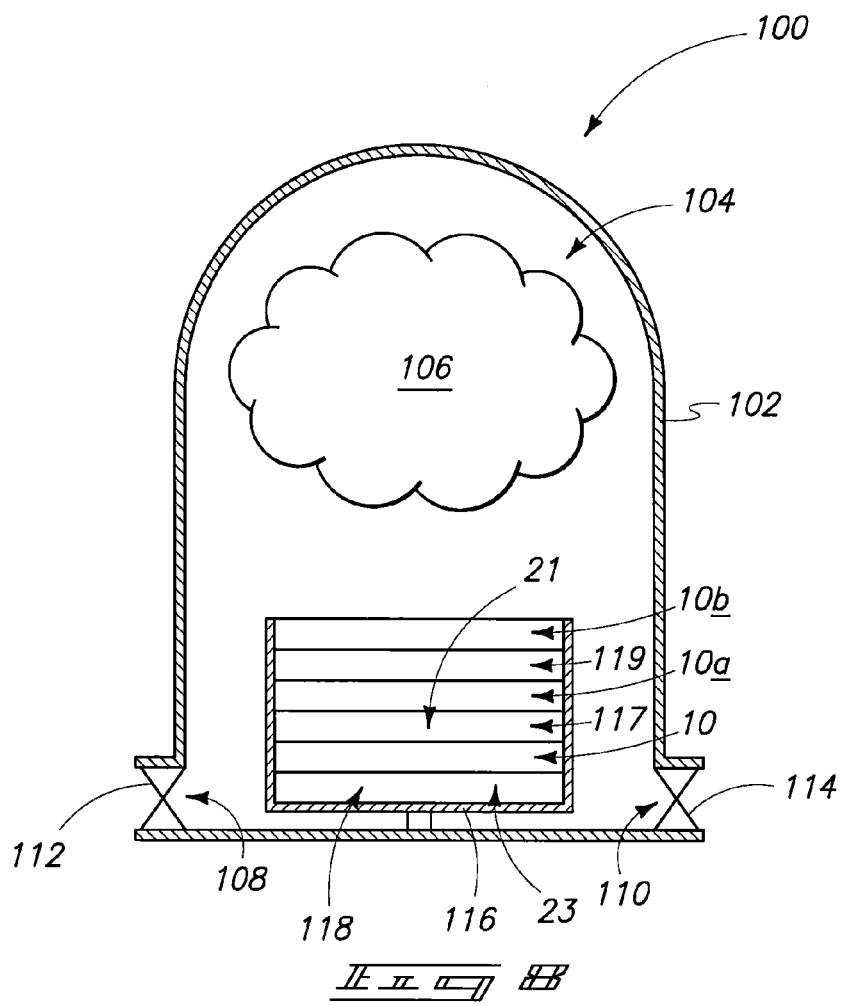
FIG. 8 is a diagrammatic cross-sectional view of an apparatus that may be utilized during the processing stage of FIG. 3.

An example apparatus which may be utilized for PEALD is shown in FIG. 8 as apparatus 100. The apparatus comprises a furnace having a sidewall 102 extending around a reaction chamber 104. The reaction chamber is configured for maintaining a plasma 106 therein.

Ports 108 and 110 extended through the sidewall, and are configured so that reactant materials may be introduced into the chamber, and so that reaction by-products may be flushed from the chamber. A valve 112 is diagrammatically illustrated extending across port 108, and another valve 114 is diagrammatically illustrated extending across port 110. In operation, the valves may be utilized for controlling flow of reactants, reaction by-products, and purge gases into and out of the reaction chamber.

A substrate holder 116 is diagrammatically illustrated at the bottom of the chamber, and such is shown retaining a plurality of semiconductor constructions 10, 10a and 10b within the chamber. The semiconductor constructions may be identical to one another. Semiconductor construction 10 is shown to have a front side 21 and a back side 23, and is positioned so that the front side surface is facing upwardly.

The substrate holder 116 is configured to have a gap 118 beneath the back side of the substrate 10 so that a surface of the back side is exposed to ALD conditions within the chamber. Accordingly, material may be simultaneously deposited across both the front side 21 and the back side 23 during ALD within the chamber. Similar gaps 117 and 119 are beneath semiconductor constructions 10a and 10b, respectively.

Although the apparatus 100 is shown processing a batch of semiconductor constructions, in other embodiments the apparatus may be configured to process a single semiconductor construction.

PEALD is an example method for forming material 28. Any method suitable to form material 28 simultaneously on both the front side and back side of a wafer may be used. Other example methods are CVD and plasma-assisted CVD.

Referring again to FIG. 3, the insulative material 28 may be deposited to any suitable thickness. In some embodiments it may be desired to form material 28 to be very thin to avoid having the material substantially alter conventional semiconductor processing, and to reduce costs associated with the material. For instance, if material 28 consists of silicon nitride or silicon oxynitride, the material may be formed to a thickness of less than or equal to about 80 nanometers, less than about 15 nanometers, and in some embodiments may be formed to a thickness of from about 10 nanometers to about 15 nanometers. In other embodiments, it may be desired to form material 28 to be thicker so that the layer is robust when exposed to possible mechanical abrasion or other potentially damaging forces.

FIG. 10 shows an embodiment alternative to that of FIG. 3. Specifically, FIG. 10 shows an embodiment in which the insulative material 28 is formed to be between the materials 24 and 26, rather than over material 26. Regardless, the material 28 of FIG. 10, like that of FIG. 3, is simultaneously formed across both the front and back sides of the semiconductor construction.

Figure 4:
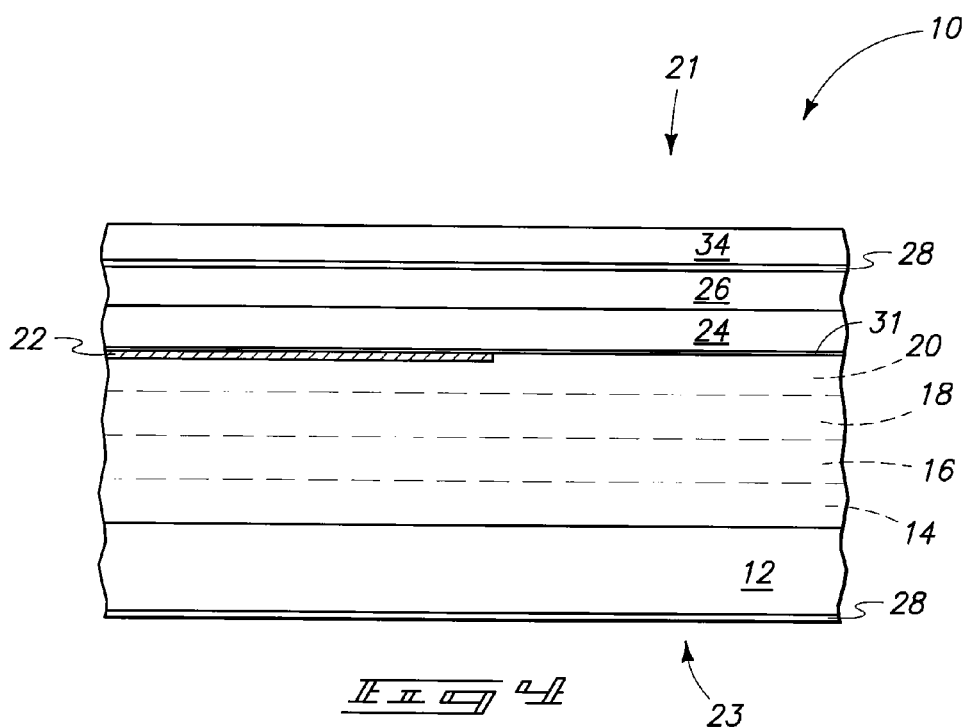
FIG. 4 shows the fragment of FIG. 1 at a processing stage subsequent to that of FIG. 3.

Referring to FIG. 4, an insulative material 34 is formed over (and in the shown embodiment, directly against) material 28 across the front side 21 of semiconductor construction 10. Insulative material 34 may comprise any suitable composition or combination of compositions; and may, for example, comprise, consist essentially of, or consist of photosensitive polyimide. Material 34 may be formed to a thickness of at least about 1000 nanometers. In some embodiments material 34 may be replaced by conventional photoresist.

Material 34 may be formed by any suitable processing, including, for example, spin-on processing and/or CVD. Material 34 may be formed while the front side 21 of construction 10 faces upwardly.

Figure 5:
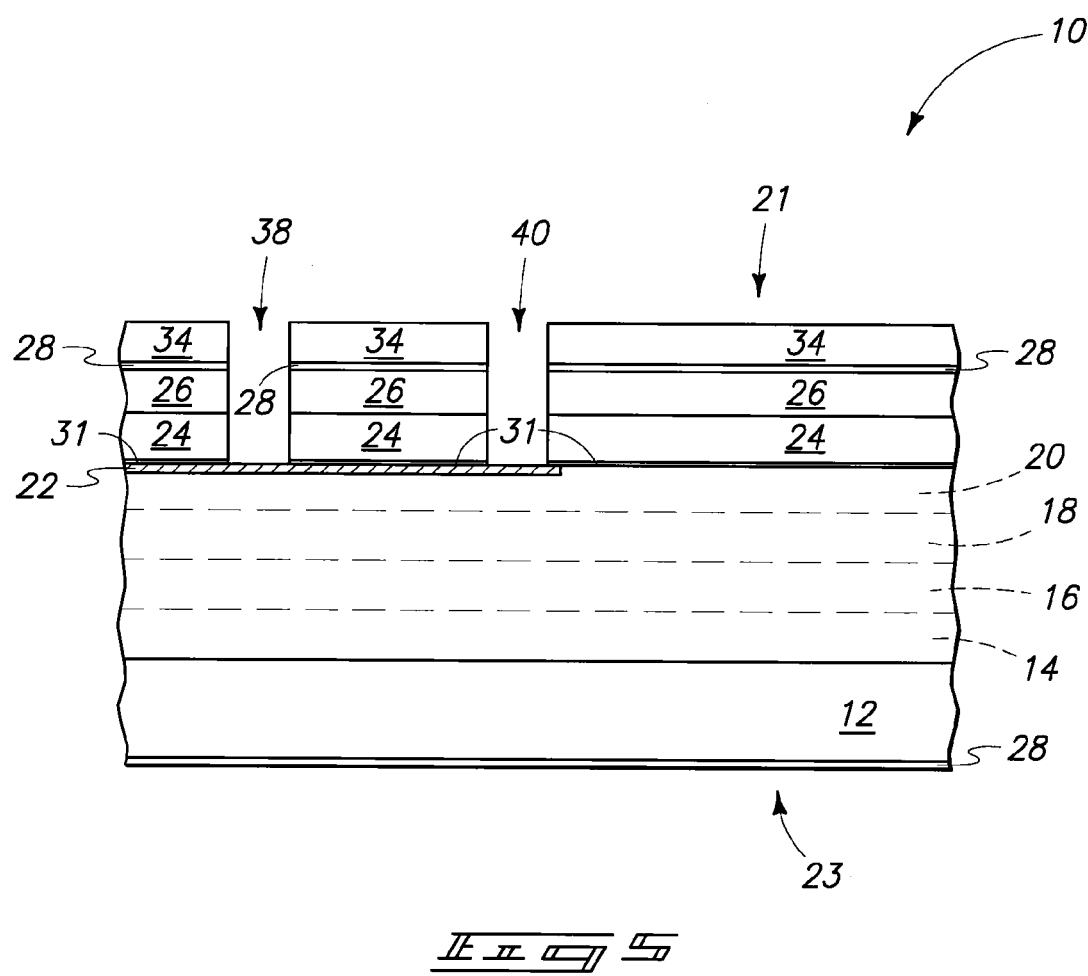
FIG. 5 shows the fragment of FIG. 1 at a processing stage subsequent to that of FIG. 4.

Referring to FIG. 5, material 34 is patterned to form a pair of openings 38 and 40 extending therethrough. Such patterning may comprising photolithographic patterning of the photosensitive material 34.

Construction 10 is subsequently subjected to appropriate etching conditions to extend openings 38 and 40 through materials 24, 26, 28, 31 and 34. Accordingly, the openings are extended to expose an upper surface of conductive material of line 22. Construction 10 may remain in an orientation with the front side 21 facing upwardly during the etching utilized to extend openings 38 and 40 through materials 24, 26, 28, 31 and 34. In some embodiments, the openings may penetrate partially through line 22.

Referring to FIG. 6, conductive material 50 is formed within openings 38 and 40. The conductive material may be formed by dipping construction 10 within a plating bath, as is diagrammatically illustrated in FIG. 9. Material 34 is shown remaining over layer 28 during the filling of openings 38 and 40, as may be the case if material 34 is photosensitive polyimide used to pattern DRAM cells. In other embodiments, material 34 may be removed prior to filling the openings, as may be the case if material 34 is photoresist used to pattern NAND memory cells.

Figure 9:
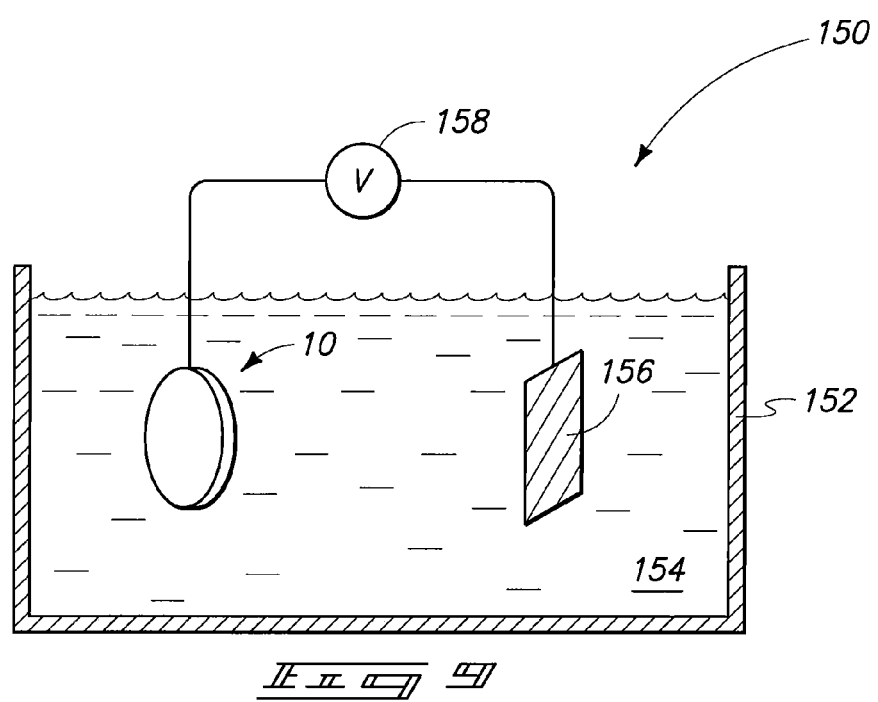
FIG. 9 is a diagrammatic cross-sectional view of an apparatus that may be utilized during the processing stage of FIG. 6.

More specifically, FIG. 9 shows an apparatus 150 which comprises a vessel 152 that retains a plating solution (or bath) 154. The plating solution may be suitable for electroless plating of conductive material 50 (FIG. 6), or for electrolytic plating of the material. In the shown embodiment, the apparatus is configured for electrolytic plating. Accordingly, an electrode 156 extends within bath 154 together with semiconductor construction 10; and the electrode is electrically connected to the semiconductor construction 10 through a power source 158. In operation, electrical power is provided by source 158 to drive transfer of material from one or both of electrode 156 and bath 154 to semiconductor construction 10 to form material 50 (FIG. 6) within openings 38 and 40 (FIG. 6).

If electroless plating is utilized instead of electrolytic plating, the power source 158 and electrode 156 may be omitted, and instead material may electrolessly transfer from bath 154 onto a surface of line 22 to grow conductive material 50 (FIG. 6) within openings 38 and 40 (FIG. 6). In embodiments in which electroless plating is utilized, a surface of conductive material of line 22 (FIG. 6) may be first activated to enhance growth of material 50 over such surface.

Referring again to FIG. 6, conductive material 50 may comprise any suitable composition or combination of compositions. For instance, conductive material 50 may comprise one or more of nickel, palladium and gold. In some embodiments, material 50 may comprise a palladium/nickel alloy. Although material 50 is shown to be homogeneous, the material may comprise multiple discrete layers formed by utilizing multiple separate plating steps. For instance, material 50 may comprise a layer of nickel having a layer of gold thereon.

Material 50 within openings 38 and 40 ultimately forms conductive contact regions (i.e., bond pads) where electrical contact is formed to circuitry external of construction 10. For instance, solder, wire bonds, etc., may be bonded to material 50; and may be in electrical connection with integrated circuitry of one or more of levels 14, 16, 18 and 20 through conductive material 50 and electrically conductive line 22.

Material 50 is shown extending outwardly of openings 38 and 40, and laterally beyond the openings to be across an upper surface of material 34. In some embodiments, the plating may form material 50 to be entirely contained within the openings, rather than extending outwardly of the openings as shown in FIG. 6. If material 50 extends outwardly of the openings, the material extending above layer 34 may be removed by chemical-mechanical polishing to form the structure shown in FIG. 7.

The insulative material 28 protects the backside 23 of semiconductor construction 10 from deposition of plated material 50 during the growth of material 50 within openings 38 and 40.

In some embodiments, the utilization of ALD (or other suitable methods) to form material 28 enables a layer of material to be extended across the back side of the construction 10 without flipping the construction during formation of such layer. Such may avoid cracking and other defects which may be induced during prior art flipping of a wafer. Additionally, utilization of ALD (or other suitable methods) at an appropriate temperature to form material 28 may enable activation of hydrogen of a passivation layer (or other advantages of suitable thermal treatment and/or annealing of one or both of passivation layers 24 and 26) to be conducted simultaneously with the deposition of material 28, which can consolidate processing steps relative to prior art procedures which formed a protective insulative layer along a back side of a wafer in a separate process step from thermal treatment of one or more passivation layers over the front side of the wafer.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A semiconductor processing method, comprising:
forming a first layer of a composition across a front side of a semiconductor construction while forming a second layer of the composition across a back side of the semiconductor construction, where the back side is in opposing relation to the front side;
forming a layer of insulative material over the first layer of the composition;
etching a pattern of openings extending through the layer of insulative material and through the first layer of the composition;
dipping the semiconductor construction in a plating bath to form conductive material within the openings; and
wherein the forming the first and second layers of the composition comprises utilization of plasma-enhanced atomic layer deposition; and wherein the semiconductor construction remains in an orientation with the front side facing up during the recited utilization of the plasma-enhanced atomic layer deposition, formation of the layer of insulative material, and etching of the pattern of openings.

2. A semiconductor processing method, comprising:
forming a first layer of a composition across a front side of a semiconductor construction while forming a second layer of the composition across a back side of the semiconductor construction, where the back side is in opposing relation to the front side;
forming a layer of insulative material over the first layer of the composition;
etching a pattern of openings extending through the layer of insulative material and through the first layer of the composition;
dipping the semiconductor construction in a plating bath to form conductive material within the openings; and
wherein the forming the first and second layers of the composition comprises utilization of plasma-enhanced atomic layer deposition and wherein the semiconductor construction remains in an orientation with the front side facing up during the recited utilization of the plasma-enhanced atomic layer deposition;
wherein the plasma-enhanced atomic layer deposition is conducted while a maximum temperature of the semiconductor construction is less than or equal to about 500° C.

3. A semiconductor processing method, comprising:
forming a semiconductor substrate to comprise one or more electrically conductive layers across a front side of the substrate, and to comprise one or more passivation layers over the one or more electrically conductive layers; the semiconductor substrate comprising a back side in opposing relation to the front side; the back side having an exposed surface, and the front side having an exposed surface comprising a surface of a passivation layer;
utilizing plasma-enhanced atomic layer deposition to simultaneously deposit a composition across the front side exposed surface and across the back side exposed surface; the composition on the front side exposed surface being a first layer of the composition, and the composition across the back side exposed surface being a second layer of the composition;
forming a layer of insulative material over the first layer of the composition;
etching a pattern of openings extending through the layer of insulative material, through the first layer of the composition and through the one or more passivation layers to expose regions of the one or more electrically conductive layers; and
dipping the wafer in a plating bath to form conductive material within the openings.

4. The method of claim 3 wherein the one or more passivation layers comprise a silicon dioxide passivation layer and a silicon nitride passivation layer.

5. The method of claim 3 wherein the semiconductor substrate remains in an orientation with the front side facing up during the recited utilization of the plasma-enhanced atomic layer deposition, and during the recited formation of the layer of insulative material.

6. The method of claim 3 wherein the composition comprises one or both of silicon nitride and silicon oxynitride.

7. The method of claim 3 wherein the conductive material comprises one or more of nickel, gold and palladium.

8. A semiconductor processing method, comprising:
forming a semiconductor substrate to comprise at least one bond pad supporting layer along a front side of the substrate, and to comprise a silicon nitride passivation layer over the at least one bond pad supporting layer; the semiconductor substrate comprising a back side in opposing relation to the front side; the back side having an exposed surface, and the front side having an exposed surface comprising a surface of the silicon nitride passivation layer;
utilizing plasma-enhanced atomic layer deposition to simultaneously deposit insulative material across the front side exposed surface and across the back side exposed surface; the plasma-enhanced atomic layer deposition being conducted at a temperature of from at least about 300° C. to less than or equal to about 500° C. to activate hydrogen in the silicon nitride passivation layer during the deposition;

etching a pattern of openings extending through the insulative material and through the silicon nitride passivation layer to expose regions of the at least one bond pad supporting layer; and dipping the wafer in a plating bath to form conductive material within the openings, the conductive material within the openings being contacts to the semiconductor wafer front side.

9. The method of claim 8 wherein the dipping forms the conductive material to extend laterally beyond the openings, and further comprising utilizing chemical-mechanical polishing to remove the conductive material from laterally beyond the openings.

10. The method of claim 8 wherein the insulative material consists of silicon nitride or silicon oxynitride.

11. A semiconductor processing method, comprising:
forming a semiconductor substrate to comprise one or more levels of integrated circuitry over a front side of a semiconductor wafer, and to comprise one or more bond pad supporting layers over the integrated circuitry; the semiconductor substrate comprising a back side in opposing relation to the front side of the semiconductor wafer; the back side having an exposed surface;

forming a passivation oxide over the one or more bond pad supporting layers;

forming a passivation nitride over the passivation oxide;

utilizing plasma-enhanced atomic layer deposition to simultaneously deposit a composition across a surface of the passivation nitride and across the back side surface; the composition deposited across the front side surface being a first layer of the composition, and the composition deposited across the back side surface being a second layer of the composition; the plasma-enhanced atomic layer deposition being conducted at a temperature less than or equal to about 500° C. but high enough to thermally treat the passivation nitride to cause hydrogen migration from the passivation nitride, and;

forming a polyimide-containing layer over the first layer of the composition;

etching a pattern of openings extending through the polyimide-containing layer, through the first layer of the composition and through the passivation nitride to expose regions of the bond pad supporting layers; and dipping the wafer in a plating bath to form conductive material within the openings, the conductive material within the openings being contacts to the bond pad supporting layer.

12. The method of claim 11 wherein the temperature is above 300° C.

13. The method of claim 11 wherein the passivation oxide consists of silicon dioxide.

14. The method of claim 11 wherein the wafer consists of monocrystalline silicon.

15. The method of claim 11 wherein the passivation nitride consists of silicon nitride or silicon oxynitride.

16. The method of claim 11 wherein the conductive material comprises one or more of nickel, gold and palladium.

17. The method of claim 11 wherein the composition comprises one or both of silicon nitride and silicon oxynitride.

18. The method of claim 11 wherein the integrated circuitry comprises one or more of logic, DRAM and NAND.

19. The method of claim 11 wherein the wafer remains in an orientation with the front side facing up during the recited utilization of the plasma-enhanced atomic layer deposition, and during the recited formation of the polyimide-containing layer.

* * * * *

UNITED STATES PATENT AND TRADEMARK OFFICE
CERTIFICATE OF CORRECTION

PATENT NO. : 7,704,884 B2 Page 1 of 1
APPLICATION NO. : 12/101332
DATED : April 27, 2010
INVENTOR(S) : Junting Liu et al.

It is certified that error appears in the above-identified patent and that said Letters Patent is hereby corrected as shown below:

On the title page, item (57), under "Abstract", in column 2, line 11, after "utilized" delete "to".

Signed and Sealed this

Fifteenth Day of June, 2010

David J. Kappos
*Director of the United States Patent and Trademark Office*

UNITED STATES PATENT AND TRADEMARK OFFICE
CERTIFICATE OF CORRECTION

| | | |
|---|---|---|
| PATENT NO. | : 7,704,884 B2 | Page 1 of 1 |
| APPLICATION NO. | : 12/101332 | |
| DATED | : April 27, 2010 | |
| INVENTOR(S) | : Liu et al. | |

It is certified that error appears in the above-identified patent and that said Letters Patent is hereby corrected as shown below:

Col. 8, Line 40 – Replace "wafer" with --semiconductor substrate--.

Col. 9, Line 9 – Replace "wafer" with --semiconductor substrate--.

Col. 9, Line 12 – Replace "wafer" with --semiconductor substrate--.

Col. 10, Line 11 – Replace "the bond" with --the one or more bond--.

Col. 10, Line 14 – Replace "the bond" with --the one or more bond--.

Col. 10, Line 15 – Replace "layer" with --layers--.

Signed and Sealed this
Twenty-ninth Day of March, 2011

David J. Kappos
*Director of the United States Patent and Trademark Office*